United States Patent
Smithers et al.

(10) Patent No.: US 8,032,385 B2
(45) Date of Patent: *Oct. 4, 2011

(54) METHOD FOR CORRECTING METADATA AFFECTING THE PLAYBACK LOUDNESS OF AUDIO INFORMATION

(75) Inventors: Michael John Smithers, Kareela (AU); Jeffrey Charles Riedmiller, Martinez, CA (US); Charles Quito Robinson, San Francisco, CA (US); Brett Graham Crockett, Brisbane, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 126 days.

This patent is subject to a terminal disclaimer.

(21) Appl. No.: 12/566,621

(22) Filed: Sep. 24, 2009

(65) Prior Publication Data

US 2010/0250258 A1    Sep. 30, 2010

Related U.S. Application Data

(63) Continuation of application No. 10/884,177, filed on Jul. 1, 2004, now Pat. No. 7,617,109.

(51) Int. Cl.
*G10L 19/00* (2006.01)
*G10L 21/00* (2006.01)
*H04R 5/00* (2006.01)
*H03G 5/00* (2006.01)
*H03G 3/00* (2006.01)

(52) U.S. Cl. .......... 704/500; 381/22; 381/104; 381/106; 381/107

(58) Field of Classification Search .......... 704/206–219, 704/500; 381/22, 104, 106, 107
See application file for complete search history.

(56) References Cited

U.S. PATENT DOCUMENTS

| | | | | |
|---|---|---|---|---|
| 5,682,463 | A * | 10/1997 | Allen et al. | 704/230 |
| 5,774,470 | A | 6/1998 | Nishiya et al. | |
| 5,873,058 | A | 2/1999 | Yajima et al. | |
| 7,155,385 | B2 * | 12/2006 | Berestesky et al. | 704/215 |
| 7,398,207 | B2 * | 7/2008 | Riedl | 704/225 |
| 2005/0078840 | A1 | 4/2005 | Riedl | |
| 2007/0092089 | A1 * | 4/2007 | Seefeldt et al. | 381/104 |

FOREIGN PATENT DOCUMENTS

| | | |
|---|---|---|
| WO | WO-2004/038538 | 5/2004 |
| WO | WO-2004/111994 | 12/2004 |

OTHER PUBLICATIONS

Riedmiller, J., "Solving TV Loudness Problems—Can you 'Accurately' Hear the Difference" Communications Technology, Feb. 2004.
Foti, F., "DTV Audio Processing: Exploring the New Frontier," OMNIA, Nov. 1998, pp. 1-3.
Vickers, "Automatic Long-term Loudness and Dynamics Matching," Conv. Paper 5495, AES 111th Convention, New York, Sep. 2001.

(Continued)

*Primary Examiner* — James S. Wozniak
*Assistant Examiner* — Matthew Baker

(57) ABSTRACT

A coded signal conveys encoded audio information and metadata that may be used to control the loudness of the audio information during its playback. If the values for these metadata parameters are set incorrectly, annoying fluctuations in loudness during playback can result. The present invention overcomes this problem by detecting incorrect metadata parameter values in the signal and replacing the incorrect values with corrected values.

12 Claims, 5 Drawing Sheets

OTHER PUBLICATIONS

"Catch the Next Innovation Dolby E, Multichannel Audio Coding for DTV Production and Distribution," Dolby Laboratories, 2003.
"All About Audio Metadata;" Dolby Laboratories, 2001.
"Dolby DP570 Multichannel Audio Tool;" Dolby Laboratories.
"Post It with Dolby E;" Dolby Laboratories, 2003.
Allen, "Are Movie Too Loud?," presented at SMPTE Film Conference, Mar. 22, 1997.
Schwind, "IVolume Loudness adjustment for iTunes;" http://www.mani.de/en/software/macosx/ ivolume.
Sokol, "Secret Encoder Ring;" http://emusician.com/tutorials/emusic_secret_encoder_ring, Oct. 1, 2001.
"Dolby Metadata Guide," Issue 2, Dolby Laboratories, 2003.
"Dolby Model LM100 Broadcast Loudness Meter User's Manual," Issue 2, Part # 91846, Dolby Laboratories, 2003.

* cited by examiner

METHOD FOR CORRECTING METADATA AFFECTING THE PLAYBACK LOUDNESS OF AUDIO INFORMATION

TECHNICAL FIELD

The present invention is generally related to audio encoding and playback, and pertains more specifically to controlling the loudness and dynamic range of audio information during playback.

BACKGROUND ART

There is a growing level of dissatisfaction among consumers and audio professionals alike with extreme variations in the loudness of the audio in radio and television broadcasts and in pre-recorded audio material. Large variations in loudness often occur as listeners tune from one station to another, as the program received from a given station switches between a main feature and commercial advertisements, and as listeners change media in their playback systems such as switching between different compact discs or different DVDs. Listeners are often forced to adjust the volume controls of their receivers and playback systems to maintain a relatively uniform loudness.

One solution that has been proposed to overcome this problem is the use of control information or "metadata" that accompanies the audio information. Metadata, or data that describes the audio data, may be provided in a broadcast or recorded signal to control the playback loudness of the audio information. One example of this type of metadata is described in the Advanced Television Systems Committee (ATSC) A/52A document entitled "Revision A to Digital Audio Compression (AC-3) Standard" published Aug. 20, 2001. This particular standard specifies metadata that includes the parameters, DIALNORM, COMPR and DYNRNG, which pertain to playback signal level and dynamic range. Both signal level and dynamic range affect the perceived or subjective level of a signal, which is referred to as loudness. Receivers that conform to this ATSC audio standard use the DIALNORM parameter to control playback signal levels, and may use the COMPR and DYNRNG parameters to control compression of playback signal dynamic range.

If this type of metadata is used properly during audio content creation, distribution, broadcast and recording processes, the problem with excessive variations in playback loudness could be eliminated or at least greatly reduced. Unfortunately, metadata is sometimes misused or not used at all because it is misunderstood, because the appropriate people do not know how to use it properly, or because it is used to create artistic effects in inappropriate ways.

DISCLOSURE OF INVENTION

It is an object of the present invention to provide for the correction of playback loudness and dynamic range of audio information during playback.

According to one aspect of the present invention, a method for correcting playback loudness and dynamic range of audio information receives an input signal conveying data representing a first loudness normalization level, a first dynamic range adjustment level and encoded audio information produced by an encoding process; obtains decoded audio information from an application of a decoding process to the input signal; obtains a measure of loudness from an analysis of the decoded audio information and derives a second loudness normalization level from the measure of loudness; obtains an estimate of a compression profile used by the encoding process from an analysis of the decoded audio information and from the first dynamic range adjustment level; and generates an output signal that conditionally conveys data representing the second loudness normalization level and a range adjustment level obtained in response to audio information amplitude, the second loudness normalization level and the estimate of the compression profile.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Introduction

Figure 1:
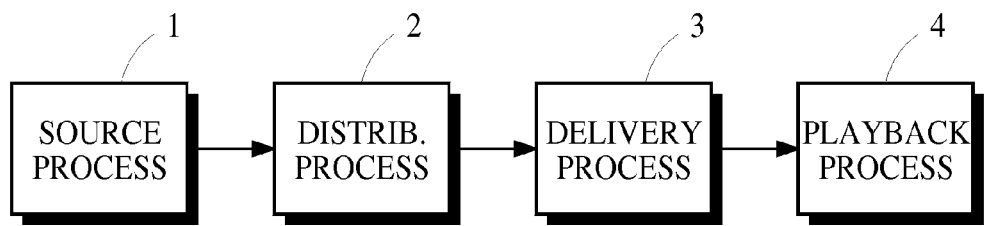
FIG. 1 is schematic block diagram of processes that occur in a typical broadcasting and recording systems.

FIG. 1 is schematic illustration of processes that occur in a typical broadcasting or recording system. The source process 1 represents activities that obtain audio information by synthesis or by capture from a source such as a live musical performance or sporting event. The distribution process 2 represents a wide range of activities that receive audio information from one or more sources and assemble all or part of this information into a finished program for broadcasting or recording. Video information as well as other types of information may also be obtained and assembled into the finished program in a variety of ways. The delivery process 3 represents activities that cause the finished program to be broadcasted or recorded and subsequently delivered to the playback process 4. During some or all of these processes, the audio information may be encoded to reduce its information capacity requirements so that it can be stored in less space or transmitted using lower bandwidth.

In preferred implementations of broadcasting and recording systems, each of the processes shown in FIG. 1 allows audio content authors and audio engineers to specify metadata that define the intended loudness and dynamic range of the audio information during its playback. Unfortunately, even in these preferred implementations, this type of metadata is either mistakenly used incorrectly or it is deliberately misused. The present invention is directed toward methods and apparatuses that may be used to correct the playback loudness and dynamic range of audio information during playback. The present invention may be used one or more times in any of the processes that are illustrated in FIG. 1; however, it is anticipated that the present invention may be used most efficiently near the end of the distribution process 2 or near the beginning of the delivery process 3. For example, the present invention could be used immediately prior to broadcasting or recording a finished program.

Implementations of the present invention described below include features pertinent for use with signals conveying encoded audio information in a format that complies with the ATSC standard mentioned above. These particular implementations and features are merely examples. Principles of the present invention may be used advantageously with essentially any form of signal that conveys audio information and metadata related to the loudness and dynamic range of that audio information.

B. Device Overview

Figure 2:
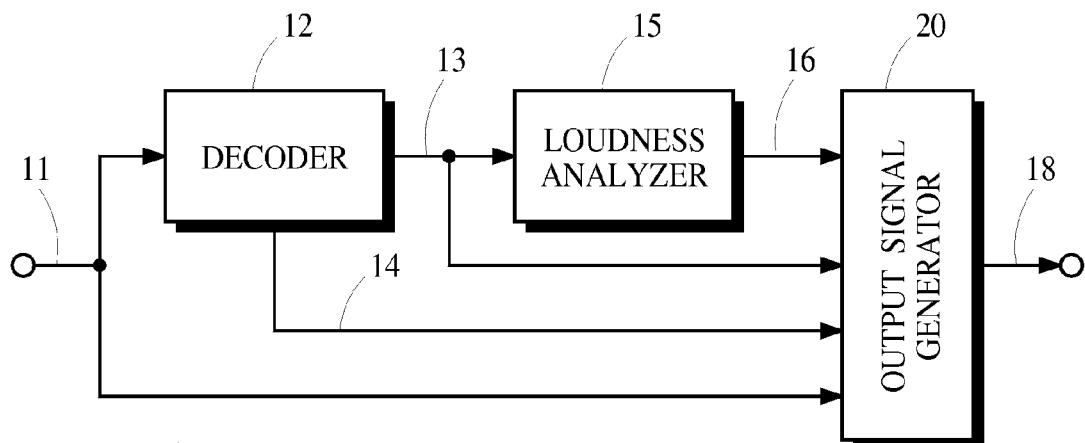
FIG. 2 is a schematic block diagram of a device providing an output signal with audio information and metadata that may be used to correct the playback loudness and dynamic range of the audio information.

FIG. 2 is a schematic block diagram of a device 10 incorporating various aspects of the present invention that may be used to correct the playback loudness and dynamic range of audio information during playback. The device 10 receives an input signal from the communication path 11 that conveys encoded audio information and metadata, processes this information, and generates an output signal along the path 18 that conveys encoded audio information and modified metadata. The metadata represents a loudness normalization level and a dynamic range adjustment level for use during playback of the audio information.

The decoder 12 processes the input signal to obtain the metadata and a decoded representation of the audio information by performing processes that are complementary to the processes used to generate the input signal. The decoded audio information is passed along the path 13. The metadata is passed along the path 14. If the device 10 is used with an input signal having a format that complies with the ATSC standard mentioned above, for example, the decoder 12 performs processes that determine how bits were allocated to represent the spectral content of an audio signal, uses this allocation to recover quantized spectral components from the input signal, and applies synthesis filters to the recovered spectral components to generate decoded audio information. Additional information may be obtained from the ATSC document mentioned above.

The decoding process performed by the decoder 12 differs only slightly from the decoding process performed by a conventional playback system because the decoder 12 does not use the loudness normalization level and dynamic range adjustment level metadata to make any adjustments in the decoded information.

In an alternative implementation, the decoder 12 differs more significantly from conventional decoders in that it does not decode the encoded audio information into time-domain information. Instead, it decodes the encoded audio information into dequantized spectral components or transform coefficients, which are passed along the path 13 for subsequent processing. This change in the implementation of the decoder 12 affects details of implementation for the loudness analyzer 15, the dynamic range analyzer 23, the dynamic range calculator 25, the scaler 31, and the encoder 33, all discussed below, but it does not change the nature of the processing that these components perform.

The loudness analyzer 15 analyzes the decoded audio information that it receives from the path 13 to obtain a measure of loudness, which it passes along the path 16. Essentially any analysis may be used in principle; however, the choice of analysis may affect the accuracy of the loudness measure. Preferably, a measure of the loudness is obtained by isolating segments of the audio information that are predominantly speech. Some ways in which this may be done are described in U.S. patent application Ser. No. 10/233,073 by Vinton et al. entitled "Controlling Loudness of Speech in Signals That Contain Speech and Other Types of Audio Material" filed Aug. 30, 2002, publication number US 2004-0044525 published Mar. 4, 2004. The identification of segments that are predominantly speech is not essential but it usually improves the accuracy of the loudness measure. If speech is not present or is not dominant, an average loudness measure of the entire audio information may provide a sufficient measure.

The measure of loudness may be obtained for an entire audio program or it may be obtained for segments of essentially any length that may be desired. One way that a loudness measure $Leq_m$, can be calculated may be expressed as $$Leq_m = 10\log_{10}\left(\frac{1}{T}\int_0^T \left(\frac{P(t)}{P_0}\right)^2 dt\right)$$

where $P(t)$=frequency-weighted sound pressure level of the signal at time t;

$P_0$=frequency-weighted sound pressure level of the signal at time t=0; and m denotes the frequency weighting applied to the signal. One well known example of a frequency weighting that may be used is the so called "A equal-loudness" weighting. Standard B or C weighted power measures may be used. instead Alternatively, psychoacoustic models of loudness may be used such as that described in "Acoustics—Method for calculating loudness level," ISO 532 (1975). Preferably, the measure of loudness is calculated in units of dB relative to the amplitude of a digital "full-scale" sinusoid (0 dB FS), which is the largest digital level capable of being expressed by the finite-length digital values used to represent the audio information.

The output signal generator 20 processes the input signal received from the path 11, the loudness normalization level and dynamic range adjustment level metadata received from the path 14, the decoded representation of the audio information received from the path 13, and the derived measure of loudness received from the path 16, and generates along the path 18 an output signal that conveys an encoded representation of the audio signal and a set of metadata that may be used to correct the loudness and dynamic range of the audio information during playback.

Additional details of implementation are described below.

C. Signal Format

Implementations of the device 10 that are described here process an input signal with encoded audio information and metadata data conveyed in a format that complies with the ATSC standard mentioned above. The input signal comprises binary data that is arranged in frames. Each frame contains encoded audio information and metadata representing 1536 samples in each of from one to six channels of digital audio signals. The metadata is configurable and may include information such as the language of spoken audio content, whether the audio content is subject to copyright protection, and timing information. The metadata also includes a loudness normalization level and a dynamic range adjustment level for use during playback of the audio information.

Figure 5:
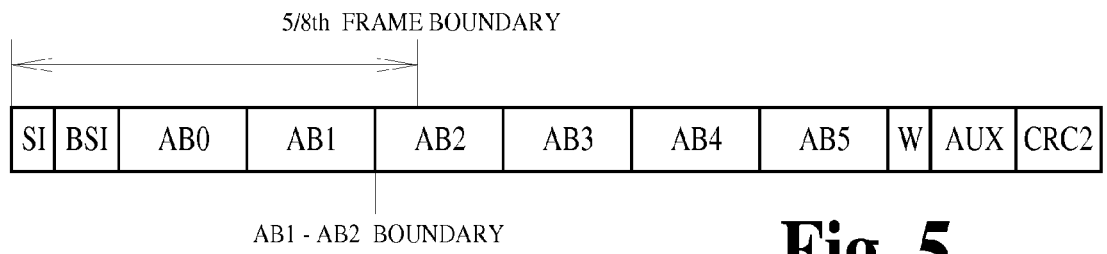
FIGS. 5-8 are schematic diagrams of signals conveying encoded audio information and metadata.
Figure 6:
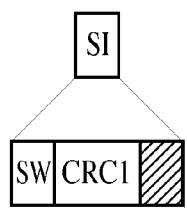
Figure 7:
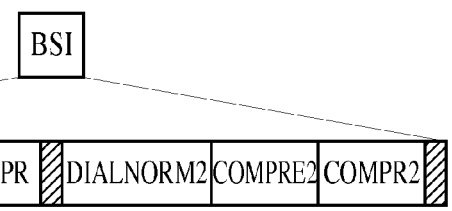
Figure 8:
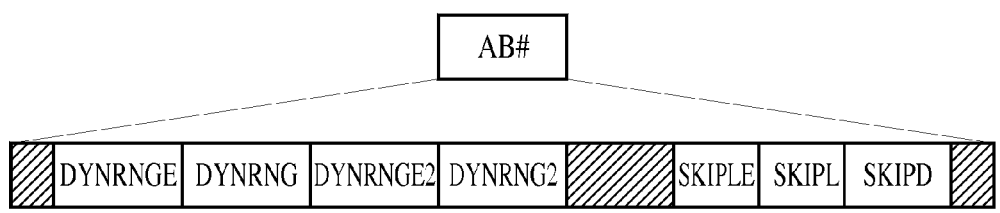

Each input signal frame is divided into sections as shown schematically in FIG. 5. The Synchronization Information (SI) section, shown in FIG. 6, conveys a synchronization word (SW) and the first of two cyclical redundancy codes (CRC1) for detection of bit errors in the first ⅝th of the frame. The Bit Stream Information (BSI) section, shown in FIG. 7, conveys most of the metadata for the frame. Six Audio Blocks (AB0 to AB5) convey the encoded audio information and additional metadata, as shown in FIG. 8. The remaining sections of the frame include a Waste (W) bits section that conveys unused bits remaining after the audio content is encoded so that each frame has a constant number of bits, an Auxiliary (AUX) section, which may convey additional metadata that is not pertinent to the present invention, and the second of two cyclical redundancy codes (CRC2) for detection of bit errors in the last ⅜th of the frame.

Loudness Normalization

The BSI section of each frame conveys a metadata parameter referred to as DIALNORM, which is a loudness normalization level for use during playback. This parameter is intended to indicate the average or predominant loudness of speech or dialogue in the audio information. In the absence of speech, the parameter may represent an average loudness of the entire content of an audio item. An "audio item" is an interval of audio information such as, for example, the audio for a 30-second television advertisement or the entire soundtrack for a full-length motion picture.

Figure 9:
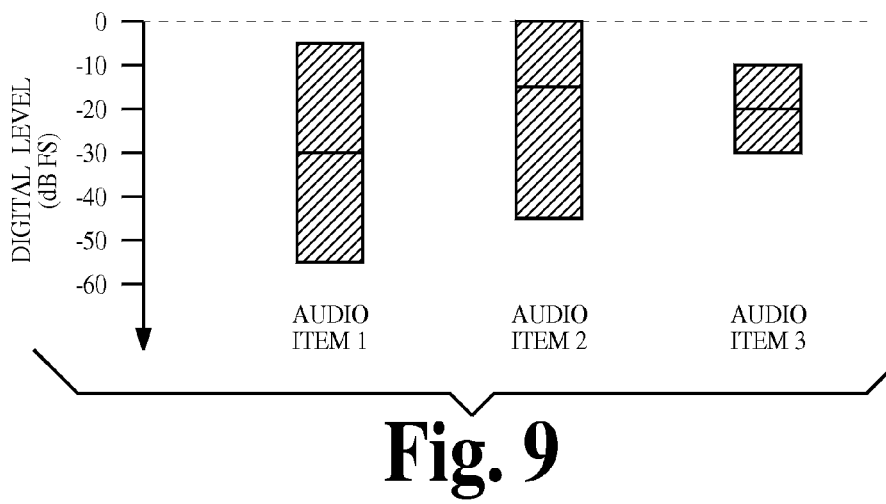
FIGS. 9-11 are hypothetical graphical illustrations of how metadata may be used to correct the loudness and dynamic range of three segments of audio information.

FIG. 9 is a graphical illustration of signal levels for three hypothetical audio items. The "Digital Level" of each audio item is the amplitude of its audio information relative to the amplitude of a digital full-scale sinusoid (0 dB FS). The maximum and minimum signal levels for each audio item are shown in the figure along with the value of its DIALNORM parameter. The DIALNORM value for each audio item is rounded to 1 dB units.

Figure 10:
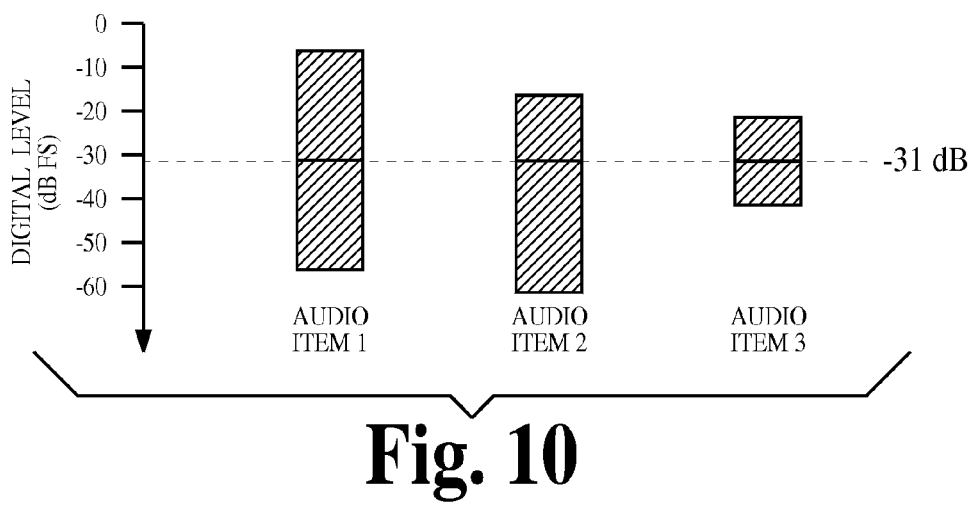

During playback, the playback process 4 uses the value of the DIALNORM parameter to scale the amplitude of the signal for playback so that the perceived loudness of speech is consistent between different audio items. FIG. 10 illustrates this process graphically. The playback process 4 adjusts the signal in each audio item so that its loudness, as indicated by the DIALNORM parameter, is scaled to equal a reference level of −31 dB FS. This reference level can be calibrated in each playback system to match a desired sound pressure level.

Dynamic Range Adjustment

Each frame of the input signal may convey metadata parameters referred to as COMPR and DYNRNG, which are dynamic range adjustment levels for use during playback. Referring to FIGS. 7 and 8, the BSI section of a frame may include a COMPR parameter that applies to the entire frame and each audio block may have its own respective DYNRNG parameter. The values for these parameters are determined during the encode process using one of several compression profiles. Each profile includes typical compression parameters that specify operational characteristics of a compressor such as compression ratio, attack and release time constants, and amplitude ranges for compression. The values for these dynamic range compression parameters are determined with reference to the DIALNORM parameter so that the average loudness of the audio item is unaltered by compression.

Figure 11:
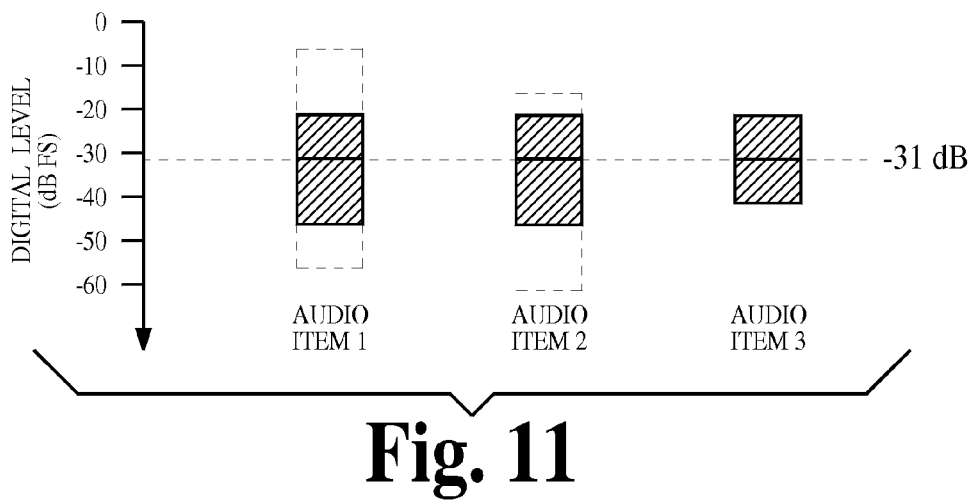

Referring again to FIG. 9, the maximum and minimum signal levels for three hypothetical audio items are shown in the figure along with the values of the DIALNORM parameters. During playback, the playback process 4 may use the COMPR parameter or the DYNRNG parameters to compress the signal for playback so that the dynamic range is reduced. FIG. 11 illustrates this process graphically. The playback process 4 compresses the signal in each audio item so that the dynamic ranges of the audio items are more uniform.

The ability to reduce the dynamic range of an audio item is useful in a variety of situations. For example, it is often desirable to reduce the audio playback level of a motion picture or television program for late-night viewing to avoid disturbing sleeping family members or occupants in adjacent dwellings. When audio items have a very large dynamic range such as is typical for many motion pictures, reducing the playback level to keep the loudest segments at tolerable levels causes much of the dialogue to be difficult to hear and almost impossible to understand. Dynamic range compression can be used to reduce the loudness of the loudest segments, allowing playback loudness to be set at a higher level so that the dialog segments can be understood. In addition, dynamic range compression can be used to increase the loudness of quiet segments that might otherwise not be heard over ambient noise in the playback environment.

Proper operation of dynamic range compression requires a proper setting for the DIALNORM parameter. If the DIALNORM parameter is set improperly, then it is very likely that dynamic range compression will alter the dialogue level in a manner that is noticeable and annoying.

Importance of Proper Values

When the DIALNORM parameter is set properly, a playback system can provide a more consistent and predictable listening experience by reducing dramatic differences in loudness and dynamic range that otherwise would exist in the playback of different audio items. Annoying differences can be eliminated or at least greatly reduced between television advertisements, television entertainment and news programs, and between different television stations.

Until now, broadcasting and recording systems have had to rely on audio content authors and audio engineers to set the DIALNORM properly. It had been anticipated that the average or predominant dialogue level of an audio item would be measured correctly and the DIALNORM parameter would be set accordingly. Unfortunately, the DIALNORM parameter is sometimes set improperly or not expressly set, which causes playback systems to use a default value that is inappropriate. This causes a discrepancy between the level indicated by the DIALNORM parameter and the actual level of dialogue in the audio, which prevents or at least impairs the ability of a playback system to provide a consistent listening experience between different audio items.

Under most circumstances, each frame conveys a single set of parameters for loudness normalization and dynamic range adjustment that applies to all channels; however, the ATSC standard allows a frame to convey a separate set of parameters for each channel in a two-channel system. Referring to FIGS. 7 and 8, the second set of parameters are shown as DIALNORM2, COMPR2 and DYNRNG2. The following discussion refers only to the first set of parameters. When two sets of parameters are present for a frame, the second set of parameters is used in the same way that the first set of parameters is used.

D. Output Signal Generator

Figure 3:
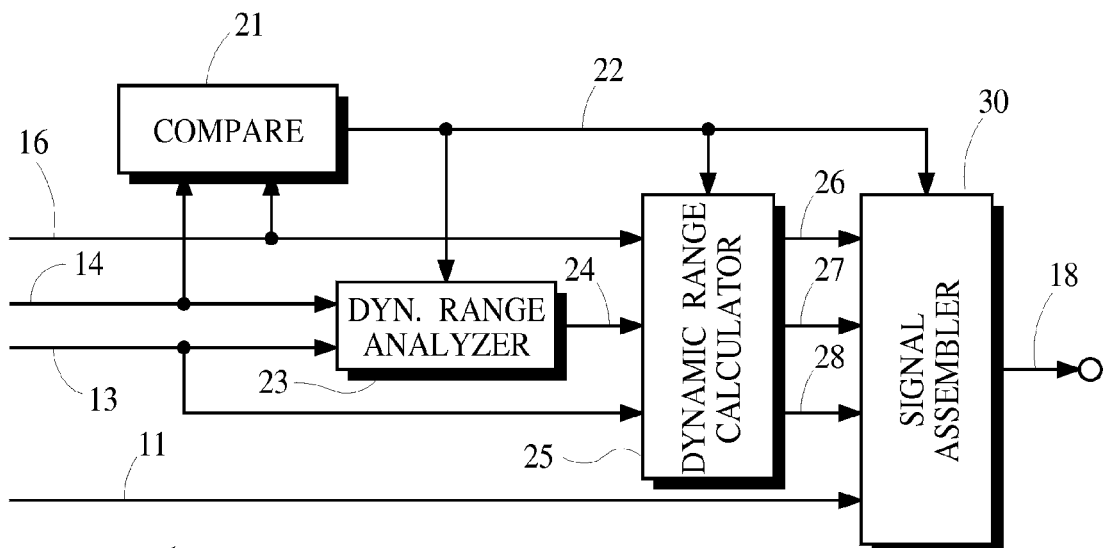
FIGS. 3-4 are schematic block diagrams of components within the device illustrated in FIG. 2.

FIG. 3 is a schematic block diagram of the output signal generator 20 discussed above in connection with FIG. 2. The comparator 21 compares the loudness normalization level (DIALNORM) metadata received from the path 14 and the derived measure of loudness received from the path 16, and generates a control signal along the path 22 that indicates whether the DIALNORM parameter is sufficiently accurate. The DIALNORM parameter may be considered sufficiently accurate if the absolute value of a difference between the two inputs is less than a threshold. If desired, this threshold may be set equal to zero but in preferred implementations a threshold is chosen to balance a tradeoff between the accuracy of the metadata parameters, the cost of the computational resources needed to implement the present invention, and the possibility that the calculated value of the DIALNORM parameter and as well as the values of other metadata parameters are incorrect and their use would degrade the quality of the audio information during playback. A threshold value of three (3 dB) is suitable for many applications.

The signal assembler 30 receives the control signal from the path 22 and the input signal from the path 11. If the control signal indicates the DIALNORM parameter is sufficiently accurate, the input signal is passed to the path 18 unaltered. If the control signal indicates the DIALNORM parameter is not sufficiently accurate, the signal assembler 30 uses the derived measure of loudness received from the path 16 by way of the path 26 to provide a modified DIALNORM parameter for the output signal.

Whenever the value of the DIALNORM parameter is changed, it is likely the values of the COMPR and DYNRNG parameters should also be changed. The COMPR and DYNRNG parameters represent gain changes that can be applied by a decoder in a conventional playback system. The COMPR parameter represents a scaling factor that may be applied to all of the audio information that is decoded from an entire frame. The DYNRNG parameter in a respective audio block represents a scaling factor that may be applied to the audio information that is decoded from that audio block.

The values of these parameters were calculated by the encoder that generated the input signal. The original values could be left unaltered in the output signal but it is likely the decoding of the resulting output signal by a conventional playback system would cause severe gain fluctuations and possibly clipping of the audio signal. A preferred implementation of the present invention provides modified values for the COMPR and/or DYNRNG parameters when it is warranted. These modified values are generated by the dynamic range analyzer 23 and the dynamic range calculator 25; however, modified values can be generated more accurately if additional information can be obtained about how the encoder calculated the original metadata values.

The additional information that is needed is the compression profile that the encoder used. Unfortunately, this information is not conveyed in the input signal. The dynamic range analyzer 23 estimates what compression profile was used by the encoder by analyzing the DIALNORM, COMPR and DYNRNG parameters received from the path 14 and the decoded representation of the audio information received from the path 13. The profile may be estimated by repeatedly using the same calculation process used by the encoder to calculate the COMPR and/or DYNRNG parameters for each compression profile known to be used by current encoder implementations. The profile that yields calculated parameter values that are closest to the original values conveyed in the input signal is deemed to be the compression profile used by the encoder. An indication of the estimated profile is passed along the path 24 to the dynamic range calculator 25.

The estimate of the compression profile may be updated for each frame or it may be updated less frequently. The frequency may be chosen to balance a tradeoff between accuracy and computational complexity.

It is possible that the estimated compression profile may be incorrect; therefore, it may be desirable to insert modified metadata into the output signal only if the value of the original DIALNORM parameter value is judged to be not sufficiently accurate as discussed above.

E. Output Signal Assembler

Figure 4:
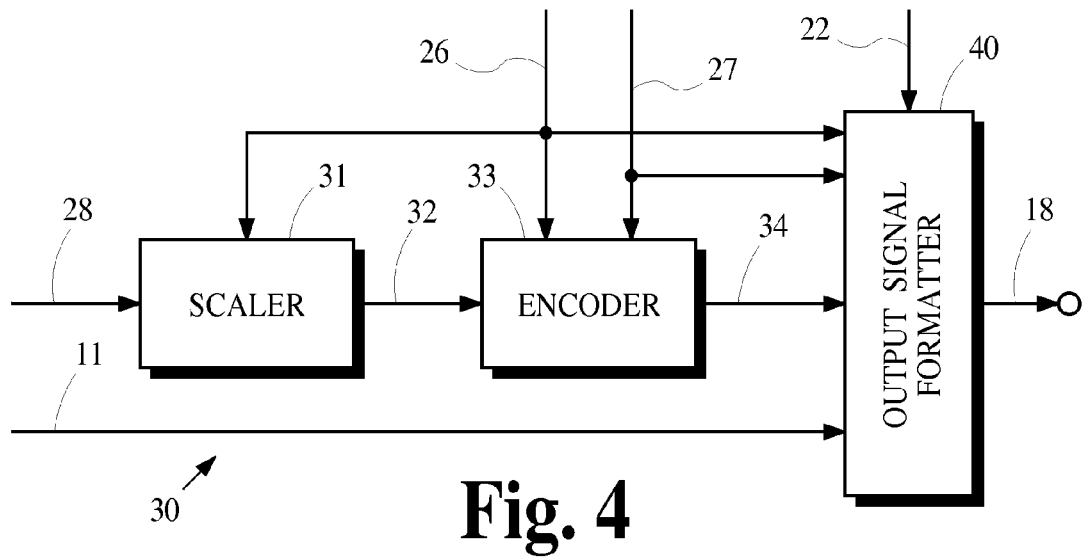

Whenever modified metadata is inserted into the output signal, the resulting output signal should conform to all requirements imposed by the ATSC standard. This is accomplished by the signal assembler 30. An alternative implementation of the signal assembler is illustrated in FIG. 4 and discussed below.

Output Signal Repacking

Figure 12:
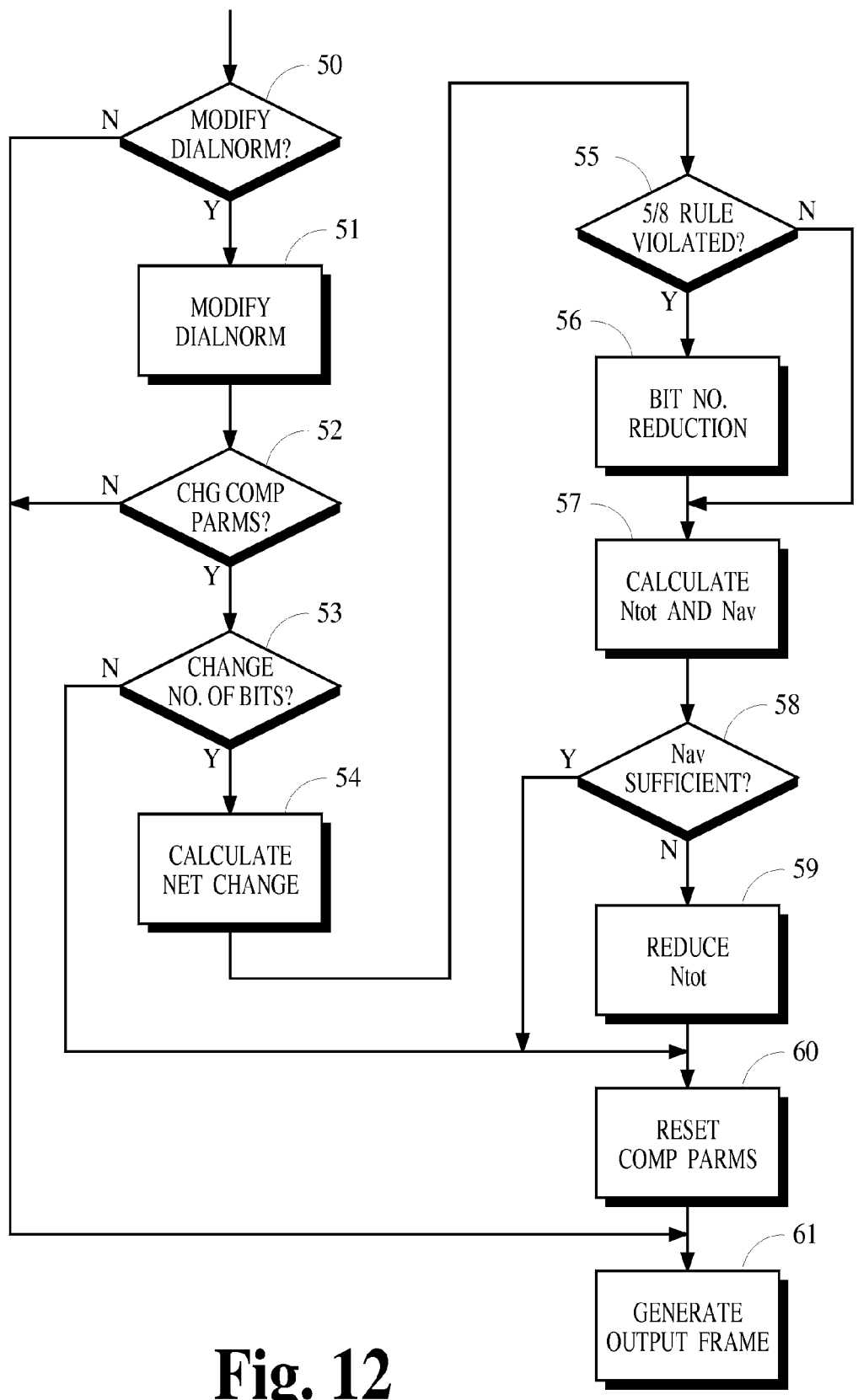
FIG. 12 is a diagram illustrating steps in a process that may be used to generate a frame of an output signal with modified metadata parameters.

The steps in one process that may be used to generate an output signal that conforms to the ATSC standard is illustrated in FIG. 12 and discussed below.

Step 50 determines whether or not the frame of the output signal is to be generated with a modified DIALNORM parameter value. This may be done by determining whether the original DIALNORM parameter value is sufficiently accurate as described above. If no modification to the DIALNORM parameter value is needed or desired, the process continues with step 61. Otherwise, the process continues with step 51.

Step 51 changes the value of the DIALNORM parameter in a frame of the output signal. The DIALNORM parameter is represented by eight bits in all signal frames that comply with the ATSC standard. The value of the DIALNORM parameter in the output signal can be easily modified by merely changing the values of the bits representing original DIALNORM parameter.

Step 52 determines whether there is any change in value for the COMPR parameter or for any DYNRNG parameter. If not, the process continues with step 61, which generates a frame of the output signal with a modified DIALNORM parameter value. Otherwise, the process continues with step 53.

The steps needed to modify COMPR and DYNRNG parameter values are more complex that the step needed to modify a DIALNORM parameter value because the COMPR and DYNRNG parameters are not always present in a frame. Modifications may change the number of bits needed to represent these parameters. Step 53 determines whether there is any change in the number of bits needed to represent a modified COMPR parameter value or any modified DYNRNG parameter value. If not, the process continues with step 60, which modifies these parameters by inserting the modified values value into the appropriate locations of the frame. Step 61 then generates a frame of the output signal with a modified DIALNORM parameter value and one or more modified values for the COMPR and DYNRNG parameters.

If step 53 determines that there is a change in the number of bits needed to represent a modified COMPR parameter value or any modified DYNRNG parameter value, then data must be moved within a frame to accommodate the changes. In this particular implementation, changes in the number of bits needed to represent a parameter occur only if a parameter is either added or removed from a frame. If a parameter is to be added, data is moved to create space for the new parameter. If a parameter is to be removed, data is moved into the space vacated by the removed parameter.

When present in a frame, the COMPR and DYNRNG parameters are each represented by eight bits. The existence of COMPR parameter in a frame is indicated by a one-bit COMPRE flag. When set to 1, the COMPRE flag indicates a COMPR parameter is present in the BSI section of an input signal frame. The existence of a DYNRNG parameter in a respective audio block (AB0 to AB5) is indicated by a one-bit DYNRNGE flag in that block. When set to 1, a DYNRNGE flag indicates a DYNRNG parameter value is present in the respective audio block. If a DYNRNG parameter is not present in audio block AB0, a default parameter value of 0 dB (no compression) is implied. If a DYNRNG parameter is not present in any of the subsequent audio blocks AB1 to AB5, then a parameter value for that audio block is implicitly equal to the parameter value of the immediately preceding block.

Step 54 calculates the net change in bits needed to represent a change in value for each of these parameters. This may be expressed as:

$$\Delta(k)=M(k)-O(k)$$

where $\Delta(k)$=net change in bits needed to represent parameter k;
$M(k)$=number of bits needed to represent the modified parameter k value; and
$O(k)$=number of bits needed to represent the original parameter k value.

A simple notation is used here to represent the metadata parameters. In this notation, parameters 0-5 correspond to the DYNRNG parameter for audio blocks AB0 to AB5, respectively, and parameter 6 corresponds to the COMPR parameter.

Step 55 uses the $\Delta(k)$ values for parameters 0, 1 and 6 to determine whether proposed modifications to the values of the COMPR parameter and the DYNRNG parameters for audio blocks AB0 and AB1 will violate what is referred to here as the ⅝th Rule. The ATSC standard requires that the boundary between audio blocks AB1 and AB2 in a frame must occur within the first ⅝th of that frame. If the number of additional bits needed to represent modified values for the COMPR parameter and/or the DYNRNG parameters in audio blocks AB0 and AB1 would require a movement of data in a frame that violates the ⅝th Rule, then the process continues with step 56, which reduces the number of bits needed to represent one or more of these modified parameter values. Otherwise, the process continues with step 57.

Step 56 makes an initial reduction in the number of bits needed to represent the modified DYNRNG parameters in audio blocks AB0 an AB1. This is done by analyzing the proposed modifications to the DYNRNGE flags for audio blocks AB0 and AB1. If only the modified DYNRNGE flag in audio block AB0 is to be set to 1, then this flag is reset to 0. If only the modified DYNRNGE flag in audio block AB1 is to be set to 1, then this flag is reset to 0. If the modified DYNRNGE flags in both audio blocks AB0 and AB1 are to be set to 1, then one of these flags is reset according to the following test:

If the absolute difference between the modified DYNRNG parameter value for audio block AB0 and 0 dB is less than the absolute difference between the modified DYNRNG parameter values for audio blocks AB0 and AB1, then the modified DYNRNGE flag for audio block AB0 is reset to 0. Otherwise, the modified DYNRNGE flag for audio block AB1 is reset to 0 and the modified DYNRNG parameter value for audio block AB0 is reset to the lesser of the two proposed modified DYNRNG parameter values for audio blocks AB0 and AB1.

If the DYNRNGE flag is to be set to 0 in both audio blocks AB0 and AB1, then the COMPRE flag is set to 0. The parameter that is associated with a flag that is reset to 0 will be omitted from the frame of the output signal. The value for the corresponding net change $\Delta(k)$ is adjusted to show a reduction of eight bits.

The required number of bits is reduced further if the initial reduction is not sufficient. The remaining DYNRNGE flag in audio blocks AB0 and AB1 that is to be set to 1 is reset to 0. The associated DYNRNG parameter will be omitted from the frame of the output signal and the value for the corresponding net change $\Delta(k)$ is adjusted to show a reduction of eight bits. The one or more reductions made in this step are guaranteed to satisfy the ⅝th Rule provided the frame of the input signal initially satisfied the ⅝th Rule.

If the dynamic range calculator 25 calculated a modified DYNRNGE flag for audio block AB2 that is equal to 0, then that calculation was performed under the assumption that a modified DYNRNG parameter value for audio block AB2 would be equal to the parameter value for audio block AB1. Any changes made to the modified DYNRNGE flags for audio blocks AB0 and AB1 to satisfy the ⅝$^{th}$ Rule would probably violate this assumption, causing an intended change to the DYNRNG parameter value for audio block AB2. The only situation that would not violate this assumption is the case where the modified DYNRNGE flags for both audio blocks AB0 and AB1 were to be set to 1 but the flag for only audio block AB0 was reset to 0. For all other situations, a preferred implementation of the present invention the modified DYNRNGE flag for audio block AB2 is reset to 1 and the modified DYNRNG parameter value is set equal to the appropriate value calculated by the dynamic range calculator 25.

The remaining steps in this process prior to the generation of the output signal ensure a sufficient number of bits are available to represent all modified compression parameters.

Step 57 determines the total number of bits needed to represent all proposed modifications to the compression parameter values and the total number of unused bits that are available in the frame to represent these modified parameter values.

The total number of bits $N_{TOT}$ that are needed to represent all proposed modifications to compression parameters may be determined by calculating the sum $$N_{TOT} = \sum_{k=0}^{6} \Delta(k)$$

The total number of unused bits $N_{AV}$ that are available in the frame to represent modified compression parameter values is calculated from information obtained from the frame. Referring to FIG. 5, each frame usually contains a number of unused bits that can be used to represent new metadata parameters added to the frame. Some of these unused bits are within the W section of the frame, which are unallocated bits that remain after the audio information is encoded. Some unused bits may exist in the Skip Data (SKIPD) area of an audio block. Each SKIPD area is associated with a SKIPL parameter that indicates the length of the SKIPD area in 8-bit bytes, and a one-bit SKIPLE flag that, if set to 1, indicates the SKIPL parameter and the associated SKIPD area exist. If a respective audio block has a SKIPLE flag set to 1 and a SKIPL parameter equal to 10, for example, then the SKIPD area of that respective audio block contains 10 bytes or 80 bits. The total number of unused bits in a frame can be determined by adding the values of all SKIPL parameters in the frame to the number of bits in the W section of the frame.

The number of bits $N_W$ in the W section may be calculated from three known values. The first value is the length $N_L$ of the frame expressed as a number of bits, which can be calculated from parameters conveyed in the SI section of the frame that specify sample rate (FSCOD) and frame size (FRM-SIZECOD). Additional information may be obtained from the ATSC document cited above. The second value is the number of bits $N_D$ used to represent the data conveyed in the SI and BSI sections, all audio blocks AB0 to AB5 and the CRC2 in the frame. The third value is the length $N_A$ of the AUX section of the frame, expresses as a number of bits. This length is conveyed in the frame at the end of the AUX section. The calculation may be expressed as $$N_W = N_L - (N_D + N_A)$$

Step 58 determines whether the number of available bits $N_{AV}$ is sufficient to satisfy the total number of bits $N_{TOT}$ needed to represent the modified compression parameters. If a sufficient number of bits are available, the process continues with step 60. If not, the process continues with step 59.

Step 59 changes one or more modified compression parameters to reduce the number of bits that are needed to represent them. This may be done by removing the DYNRNG parameter from one or more audio blocks and associating those audio blocks with the DYNRNG parameter of a preceding audio block. The modified DYNRNG parameter values and DYNRNGE flags in the six audio blocks of a frame are used to group the blocks into regions. The first region includes audio block AB0 and all audio blocks immediately following it that have their respective modified DYNRNGE flag set to 0. Additional regions, if any, each begin with an audio block having a modified DYNRNGE flag set to 1 and include all audio blocks immediately following the beginning block that have a respective modified DYNRNGE flag set to 0. The number of regions can be as few as 1 if no audio block in a frame except possibly audio block AB0 has a modified DYNRNGE flag set to 1. The number of regions can be as great as six if every audio block in the frame has a modified DYNRNGE flag set to 1. All audio blocks in a region share a common DYNRNG parameter value. If the DYNRNGE flag for audio block AB0 is set to 0, this value for the first region is specified implicitly as explained above.

If three or more regions exist, then the shared modified DYNRNG parameter value for the second region is compared with the shared modified DYNRNG parameter value for each adjacent region. The pair of regions having the closest values are combined into one region by setting the DYNRNG parameter value in the first audio block of the preceding region to the smaller of the two modified DYNRNG parameter values for the two regions and setting the DYNRNGE flag to 0 in the first audio block of subsequent region. This reduces the total number of bits needed to represent the modified DYNRNG parameters by eight bits. Regions may be combined in this manner until the total number of bits $N_{TOT}$ needed to represent the modified DYNRNG parameter values is less than or equal to the total number of bits $N_{AV}$ that are available for representation, or until only two regions remain.

When two regions exist and $N_{AV}$ is less than $N_{TOT}$, the two regions are combined as described in the preceding paragraph.

When only one region exists and $N_{AV}$ is less than $N_{TOT}$, a further reduction is made. If the proposed modified DYNRNGE flag for audio block AB0 is set to 1, resetting this flag to 0 will reduce $N_{TOT}$ by eight bits. If this flag is already set to 0 or if resetting it to 0 is not sufficient, then the only remaining change that can be done is to reset the COMPRE flag to 0. This last change is guaranteed to satisfy the bit requirements provided the frame of the input signal initially satisfied the bit requirements.

The process continues with step 60 when step 59 reduces $N_{TOT}$ so that it is less than or equal to $N_{AV}$.

Step 60 moves data within a frame when necessary to accommodate the addition or removal of compression parameters.

To modify the COMPR parameter, if the original COMPRE flag is set to 1, the original COMPR parameter value is replaced by the modified value. If the original COMPRE flag is set to 0 and the modified COMPRE flag is set to 1, the data following the COMPRE flag is moved toward the end of the frame by eight bits to make room for the new COMPR parameter. The COMPRE flag in the frame of the output signal is set to 1 and the new COMPR value is written into the newly created space. If the original COMPRE flag is set to 1 and the modified COMPRE flag is set to 0, then the COMPRE flag in the frame of the output signal is set to 0 and the data following the COMPR parameter is moved toward the beginning of the frame by eight bits because the COMPR parameter no longer exists in the frame.

To modify the DYNRNG parameter in each audio block, if the original DYNRNGE flag is set to 1, the original DYNRNG parameter value can be replaced by the modified value. If the original DYNRNGE flag is set to 0 and the modified DYNRNGE flag is set to 1, the data following the DYNRNGE flag is moved toward the end of the audio block by eight bits to make room for the new DYNRNG parameter. The DYNRNGE flag in the audio block is set to 1 and the new DYNRNG value is written into the newly created space. If the original DYNRNGE flag is set to 1 and the modified DYNRNGE flag is set to 0, then the DYNRNGE flag in the frame of the output signal is set to 0 and the data following the DYNRNG parameter is moved toward the beginning of the audio block by eight bits because the DYNRNG parameter no longer exists in the block.

It is possible that the change in the number of bits needed to represent a modified DYNRNG parameter in a respective audio block may be satisfied by making changes only in that audio block. If so, this may be done by adjusting the number of bits in the SKIPD area and moving data within the audio block. The SKIPL parameter is changed to indicate the revised length of the SKIPD area. If a DYNRNG parameter is to be added to an audio block and no SKIPD area is present in that block, then unused bits must be obtained from the W section or from another audio block.

Step 61 generates a frame of the output signal. If no metadata parameters are modified, the output signal frame may be identical to a respective input signal frame. When any data in a frame has changed, one or both of two error correction codes CRC1 and CRC2 for the frame should be recalculated. If data is changed in only the first ⅝th of the frame, it is sufficient to recalculate only the CRC1 code. If data is changed in only the last ⅜th of the frame, it is sufficient only to recalculate only the CRC2 code.

Re-Encoding

According to the ATSC standard, the DIALNORM parameter must have an integer value within the range from −1 to −31 dB, inclusive. It is possible that the measure of loudness obtained by the loudness analyzer 15 is outside this range. This situation could be handled by setting the DIALNORM parameter to the nearest value within the range but a preferred solution is to scale the audio information and scale the measure of loudness so that the DIALNORM parameter can express the correct measure of loudness. For example, if the calculated measure of loudness is −36 dB, the amplitude of the audio information can be boosted by 5 dB so that the modified DIALNORM parameter value can be set correctly to the nearest valid value of −31 dB. This solution requires that the decoded audio information be encoded after scaling. This may be accomplished by using an implementation of the signal assembler 30 as shown in FIG. 4.

In this implementation, the scaler 31 scales the decoded audio information received from the path 13 by way of the path 28 in response to the calculated measure of loudness received from the path 26. The scaled audio information is passed along the path 32 to the encoder 33, which encodes the scaled audio information. The value of the measure of loudness is adjusted to account for the scaling and passed to the output signal formatter 40 for inclusion in the output signal.

Preferably, the encoder 33 maintains all information in the BSI and AUX sections of the frame except for the DIALNORM parameter. The error correction codes CRC1 and CRC2 are recalculated and the compression metadata parameters COMPR and/or DYNRNG are recalculated using the profile specified by the information received from the path 24 by way of the path 27. This re-encoding process may degrade the perceived quality of the audio information during playback; therefore, it may be desirable to perform re-encoding only if the original DIALNORM parameter is considered not sufficiently accurate as discussed above.

The encoded information is passed along the path 34 to the output signal formatter 40, which generates an output signal along the path 18 that conveys the re-encoded audio information and the modified metadata parameter values.

If the control signal received from the path 22 indicates the original DIALNORM parameter is sufficiently accurate, the audio information does not need to be scaled and re-encoded. In this situation, the output signal formatter 40 generates the output signal by modifying the metadata parameter values in the input signal received from the path 11.

F. Hardware Implementation

Figure 13:
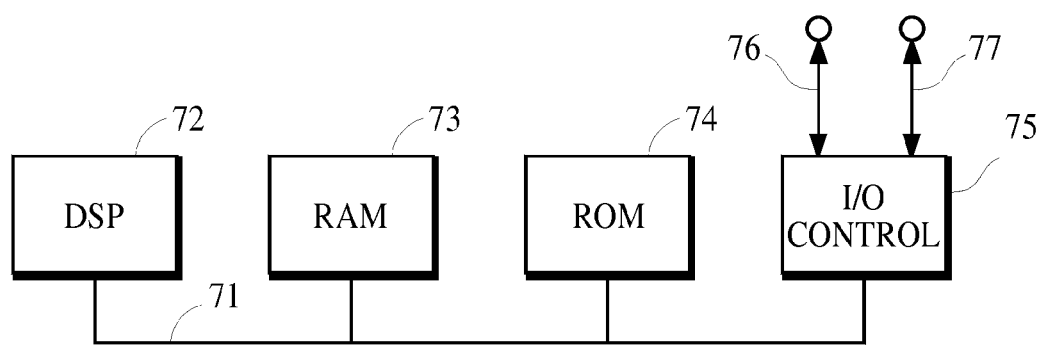
FIG. 13 is a schematic block diagram of a device that may be used to implement various aspects of the present invention.

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 13 is a schematic block diagram of a device 70 that may be used to implement aspects of the present invention. The digital signal processor (DSP) 72 provides computing resources. RAM 73 is system random access memory (RAM) used by the DSP 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals by way of the communication channels 76, 77. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device having a storage medium such as magnetic tape or disk, or an optical medium. The storage medium may be used to record programs of instructions for operating systems, utilities and applications, and may include programs that implement various aspects of the present invention. The computer system may be made tolerant to hardware failures. One way in which this may be done is to provide redundant components such as dual power supplies and redundant storage devices, and to use an operating system that is capable of detecting and reacting to faults.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method for correcting playback loudness of audio information, wherein the method comprises steps that:
   receive an input signal that conveys data representing a first loudness normalization level and first encoded audio information, wherein the data conveyed by the input signal was produced by an encoding process that generated the first encoded audio information according to psychoacoustic principles;
   obtain segments of decoded audio information from an application of a decoding process to the input signal;
   identify which of the segments of decoded audio information are predominantly speech;
   obtain a respective measure of loudness for each of the segments of audio information from an analysis of the decoded audio information that accounts for presence or absence of speech and derive a second loudness normalization level for each segment from its respective measure of loudness;
   generate an output signal that conveys data representing a third loudness normalization level and segments of third encoded audio information representing the segments of decoded audio information in an encoded form, wherein:
      if a difference between the first and second loudness normalization levels does not exceed a threshold, the third loudness level represents the first loudness normalization level, and the third encoded audio information represents the first encoded audio information, and
      if the difference between the first and second loudness normalization levels exceeds the threshold, the third loudness level is derived from the second loudness normalization level.

2. The method of claim 1 wherein, for each segment of decoded audio information that is predominantly speech, the respective measure of loudness represents loudness of the speech in the segment, and for each segment of decoded audio information that is not predominantly speech, the respective measure of loudness represents an average loudness of the audio information.

3. The method of claim 1 wherein, if the difference between the first and second loudness normalization levels exceeds the threshold, the third encoded audio information is generated by encoding the decoded audio information according to psychoacoustic principles.

4. The method of claim 1 wherein, if the difference between the first and second loudness normalization levels exceeds the threshold, the third encoded audio information represents the first encoded audio information.

5. An apparatus for correcting playback loudness of audio information, wherein the apparatus comprises:
   means for receiving an input signal that conveys data representing a first loudness normalization level and first encoded audio information, wherein the data conveyed by the input signal was produced by an encoding process that generated the first encoded audio information according to psychoacoustic principles;
   means for obtaining segments of decoded audio information from an application of a decoding process to the input signal;
   means for identifying which of the segments of decoded audio information are predominantly speech;
   means for obtaining a respective measure of loudness for each of the segments of audio information from an analysis of the decoded audio information that accounts for presence or absence of speech and derive a second loudness normalization level for each segment from its respective measure of loudness;
   means for generating an output signal that conveys data representing a third loudness normalization level and segments of third encoded audio information representing the segments of decoded audio information in an encoded form, wherein:
      if a difference between the first and second loudness normalization levels does not exceed a threshold, the third loudness level represents the first loudness normalization level, and the third encoded audio information represents the first encoded audio information, and
      if the difference between the first and second loudness normalization levels exceeds the threshold, the third loudness level is derived from the second loudness normalization level.

6. The apparatus of claim 5 wherein, for each segment of decoded audio information that is predominantly speech, the respective measure of loudness represents loudness of the speech in the segment, and for each segment of decoded audio information that is not predominantly speech, the respective measure of loudness represents an average loudness of the audio information.

7. The apparatus of claim 5 wherein, if the difference between the first and second loudness normalization levels exceeds the threshold, the third encoded audio information is generated by encoding the decoded audio information according to psychoacoustic principles.

8. The apparatus of claim 5 wherein, if the difference between the first and second loudness normalization levels exceeds the threshold, the third encoded audio information represents the first encoded audio information.

9. A non-transitory storage medium recording a program of instructions that is executable by device to perform a method for correcting playback loudness of audio information, wherein the method comprises steps that:
   receive an input signal that conveys data representing a first loudness normalization level and first encoded audio information, wherein the data conveyed by the input signal was produced by an encoding process that generated the first encoded audio information according to psychoacoustic principles;
   obtain segments of decoded audio information from an application of a decoding process to the input signal;
   identify which of the segments of decoded audio information are predominantly speech;
   obtain a respective measure of loudness for each of the segments of audio information from an analysis of the decoded audio information that accounts for presence or absence of speech and derive a second loudness normalization level for each segment from its respective measure of loudness;
   generate an output signal that conveys data representing a third loudness normalization level and segments of third encoded audio information representing the segments of decoded audio information in an encoded form, wherein:
      if a difference between the first and second loudness normalization levels does not exceed a threshold, the third loudness level represents the first loudness normalization level, and the third encoded audio information represents the first encoded audio information, and
      if the difference between the first and second loudness normalization levels exceeds the threshold, the third loudness level is derived from the second loudness normalization level.

10. The medium of claim 9 wherein, for each segment of decoded audio information that is predominantly speech, the respective measure of loudness represents loudness of the speech in the segment, and for each segment of decoded audio information that is not predominantly speech, the respective measure of loudness represents an average loudness of the audio information.

11. The medium of claim 9 wherein, if the difference between the first and second loudness normalization levels exceeds the threshold, the third encoded audio information is generated by encoding the decoded audio information according to psychoacoustic principles.

12. The medium of claim 9 wherein, if the difference between the first and second loudness normalization levels exceeds the threshold, the third encoded audio information represents the first encoded audio information.

* * * * *